United States Patent
Ohlsson

(10) Patent No.: US 8,251,711 B2
(45) Date of Patent: Aug. 28, 2012

(54) ELECTRICALLY CONDUCTIVE PLUG ARRANGED IN A GAP BETWEEN TWO ADJACENT CIRCUIT BOARDS TO CONNECT THE CIRCUIT BOARDS TO AN ELECTROMAGNETIC SHIELD

(75) Inventor: Fredrik Ohlsson, Kista (SE)

(73) Assignee: Huawei Technologies Co., Ltd., Shenzhen (CN)

(*) Notice: Subject to any disclaimer, the term of this patent is extended or adjusted under 35 U.S.C. 154(b) by 0 days.

(21) Appl. No.: 13/328,214

(22) Filed: Dec. 16, 2011

(65) Prior Publication Data

US 2012/0088377 A1 Apr. 12, 2012

Related U.S. Application Data

(63) Continuation of application No. PCT/CN2010/079824, filed on Dec. 15, 2010.

(30) Foreign Application Priority Data

Jan. 29, 2010 (SE) ........................................ 1000086

(51) Int. Cl.
*H01R 12/00* (2006.01)

(52) U.S. Cl. ............................................ 439/65

(58) Field of Classification Search ............... 439/65–74, 439/607.01, 591; 361/875; 29/840–843
See application file for complete search history.

(56) References Cited

U.S. PATENT DOCUMENTS

| 5,375,040 | A | | 12/1994 | Cooper et al. | |
|---|---|---|---|---|---|
| 5,671,531 | A | * | 9/1997 | Mugiya | 29/840 |
| 5,940,964 | A | * | 8/1999 | Mugiya | 29/840 |
| 6,176,734 | B1 | * | 1/2001 | Juntwait et al. | 439/493 |
| 6,223,973 | B1 | * | 5/2001 | Wong et al. | 228/180.1 |
| 7,118,383 | B2 | | 10/2006 | Nagata et al. | |
| 7,210,942 | B2 | * | 5/2007 | Uchida et al. | 439/67 |
| 7,252,520 | B1 | * | 8/2007 | Millard et al. | 439/77 |
| 7,753,688 | B1 | * | 7/2010 | Everson et al. | 439/61 |
| 8,007,286 | B1 | * | 8/2011 | Holec et al. | 439/65 |
| 2008/0194125 | A1 | | 8/2008 | Dahms et al. | |
| 2009/0269976 | A1 | | 10/2009 | Costello | |
| 2011/0279995 | A1 | * | 11/2011 | Bayar et al. | 361/818 |

FOREIGN PATENT DOCUMENTS

| CN | 101242039 A | 8/2008 |
|---|---|---|
| CN | 101573024 A | 11/2009 |
| DE | 299 20 597 U1 | 4/2000 |
| DE | 102007020488 A1 | 11/2007 |
| GB | 2 307 799 A | 6/1997 |
| WO | WO 2004/075611 A1 | 9/2004 |

OTHER PUBLICATIONS

International Search Report dated Mar. 31, 2011 in connection with International Patent Application No. PCT/CN2010/079824.
Supplementary European Search Report dated Apr. 5, 2012 in connection with European Patent Application No. EP 10 84 4468.

* cited by examiner

*Primary Examiner* — Chandrika Prasad

(57) ABSTRACT

A method and device for electromagnetic shielding is disclosed. An example arrangement includes a first and a second printed circuit board arranged adjacently and having an electromagnetic shield cover. An electrically conductive plug electrically provides an interconnection of the electromagnetic shielding.

13 Claims, 3 Drawing Sheets

ELECTRICALLY CONDUCTIVE PLUG ARRANGED IN A GAP BETWEEN TWO ADJACENT CIRCUIT BOARDS TO CONNECT THE CIRCUIT BOARDS TO AN ELECTROMAGNETIC SHIELD

CROSS-REFERENCE TO RELATED APPLICATIONS

This application is a continuation of International Application No. PCT/CN2010/079824, filed on Dec. 15, 2010, which claims priority to Sweden Patent Application No. 1000086-7, filed on Jan. 29, 2010, both of which are hereby incorporated by reference in their entireties.

TECHNICAL FIELD

The present invention addresses the field of electromagnetic compatibility.

BACKGROUND

The development of remote radio unit concepts requires at least two parallel aligned printed circuit boards (PCB) mounted on one common heat sink. Usually, certain components are mounted e.g. by soldering to both PCBs. These components must be shielded from other areas of the PCBs due to EMC (Electromagnetic Compatibility) radiation. This may be done by using a traditional cover with walls separating PCB areas from each other. However, because of mechanical tolerances when attaching the PCBs to the common heat sink, a gap between the board edges may not be avoided. Thus, using a single cover crossing the gap may result in EMC leakage under the cover through the gap. Therefore, according to some solutions, two separate EMC shielding covers may be used, which, however, does not allow for components to cross between two PCBs. Another solution is to use one single cover for both PCBs and have one single shielding cavity wall on each side of the board edges. This results in a double wall which may reduce the available PCB area and complicate connecting components to both PCBs.

SUMMARY

An aspect of the present invention is to provide a concept for efficiently shielding distinct printed circuit boards.

The invention is based on the finding that adjacent printed circuit boards may efficiently be electromagnetically shielded if a continuous electromagnetic shield covers both printed circuit boards and if an electrically conductive plug is provided to electrically contact at least the conductive surfaces of the printed circuit boards to each other and to the continuous electromagnetic shield.

According to an aspect, the invention relates to a printed circuit board arrangement comprising a first printed circuit board having a conductive surface, a second printed circuit board having a conductive surface, wherein the second printed circuit board is arranged adjacent, e.g. parallel, to the first printed circuit board, wherein a continuous electromagnetic shield is arranged above the first printed circuit board and the second printed circuit board. Furthermore, a conductive plug is arranged in a gap between the first printed circuit board and the second printed circuit board, the conductive plug electrically connecting electrically connecting the conductive surfaces of first printed circuit board and of the second printed circuit to each other and to the continuous electromagnetic shield. Preferably, the continuous electromagnetic shield is made of only one piece of conductive material such as metal without any discontinuities. The conductive plug connecting the conducting surfaces electrically bridges the gap between the first and the second printed circuit board and, simultaneously, electrically connects to the continuous electromagnetic shields. Furthermore, the conductive surfaces may be formed by conductive metal segments at least partly covering a surface of the respective printed circuit board. Therefore, an essentially continuous current path is provided which contributes to a radiation reduction.

According to an implementation form, the conductive plug may be arranged in a circular recess forming the gap, the recess being formed by side cut in the first printed circuit board and by a side cut in the second printed circuit board. The side cuts may penetrate the respective printed circuit board, so that the conductive plug may be in contact with e.g. a metal base optionally forming a heat sink below the printed circuit boards. The side cuts may be half-circular or square or rectangular or oval, by way of example. Thus, the recess may be circular or square or rectangular or oval. A shaft of the conductive plug may correspondingly be shaped.

According to an implementation form, the conductive plug may comprise a shaft and a plug head arranged on top of the shaft, the plug head having a spherical shape or a circular boundary. Thus, the conductive plug may be mushroom-shaped.

According to an implementation form, the conductive plug may comprise a shaft provided with axial ribs which may contribute to increasing a contact surface to side walls of the printed circuit boards because of more flexibility for radial tolerances, and e.g. non-concentric half-circles.

According to an implementation form, the conductive plug may comprise a hollow shaft which may increase a shaft's flexibility.

According to an implementation form, the conductive plug may comprise elastic material, in particular silicone or rubber, provided with conductive particles, in particular with conductive particles comprising at least one of: AG, Cu, Ag and CU, Ni, Ag and Ni, Ni and C.

According to an implementation form, the conductive plug may comprise a shaft arranged between the first printed circuit board and the second printed circuit board, and a plug head protruding above conductive surfaces of the first printed circuit board and the second printed circuit board, wherein the continuous electromagnetic shield or one of its walls comprises a recess conductively receiving the plug head. By way of example, the head of the conductive plug may, with its bottom surface, contact to the conductive surfaces, and with its upper surface contact to the continuous electromagnetic shield.

According to an implementation form, a shape of the recess may correspond to a side profile of the plug head, so that a contact surface between those elements may be increased.

According to an implementation form, the continuous electromagnetic shield or one of its walls, e.g. its edge, is provided with a conductive gasket.

According to an implementation form, the first printed circuit board and the second printed circuit board may be arranged on a heat sink, e.g. on a metal base, the metal base comprising a recess for receiving a bottom end of a shaft of the conductive plug. Thus, the plug may easily be positioned.

According to a further aspect, the invention relates to a method for producing a printed circuit board arrangement. The method comprises arranging a first printed circuit board having a conductive surface and a second printed circuit board having a conductive surface adjacent to each other, arranging a conductive plug in a gap between the first printed circuit board and the second printed circuit board to electrically connect the conductive surfaces with each other, and arranging a continuous electromagnetic shield above the first printed circuit board and above the second printed circuit board, thereby electrically connecting the continuous electromagnetic shield to the conductive plug and to the conductive surfaces.

According to an implementation form, the method may further comprise forming a half-circular side cut formed in the first printed circuit board and a half-circular side cut formed in the second printed circuit board, the half-circular side cuts forming a circular recess when arranging the first and second printed circuit board adjacent to each other, the circular recess forming the gap accommodating the conductive plug.

BRIEF DESCRIPTION OF THE DRAWINGS

Further implementation forms will be described with reference to the following Figures, in which.

DETAILED DESCRIPTION

Figure 1:
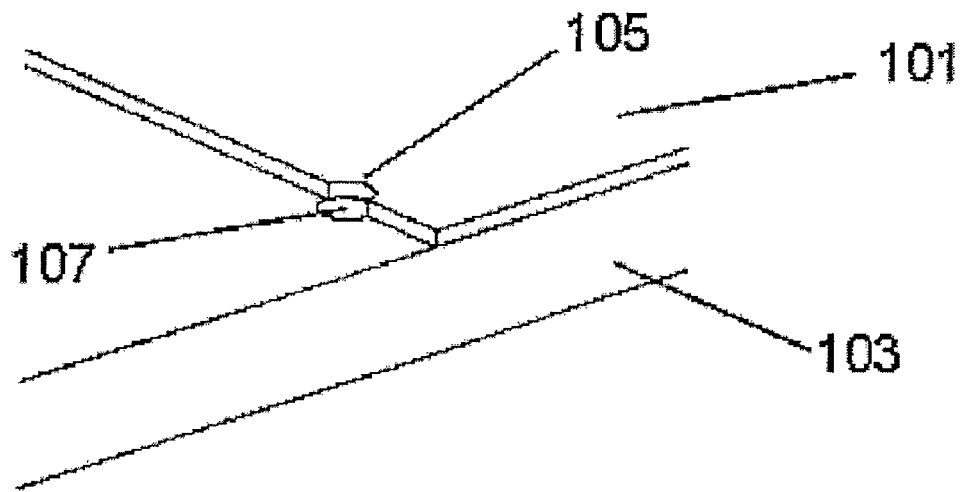
FIGS. 1 to 3 depict steps of producing a printed circuit board arrangement according to an implementation form.
Figure 2:
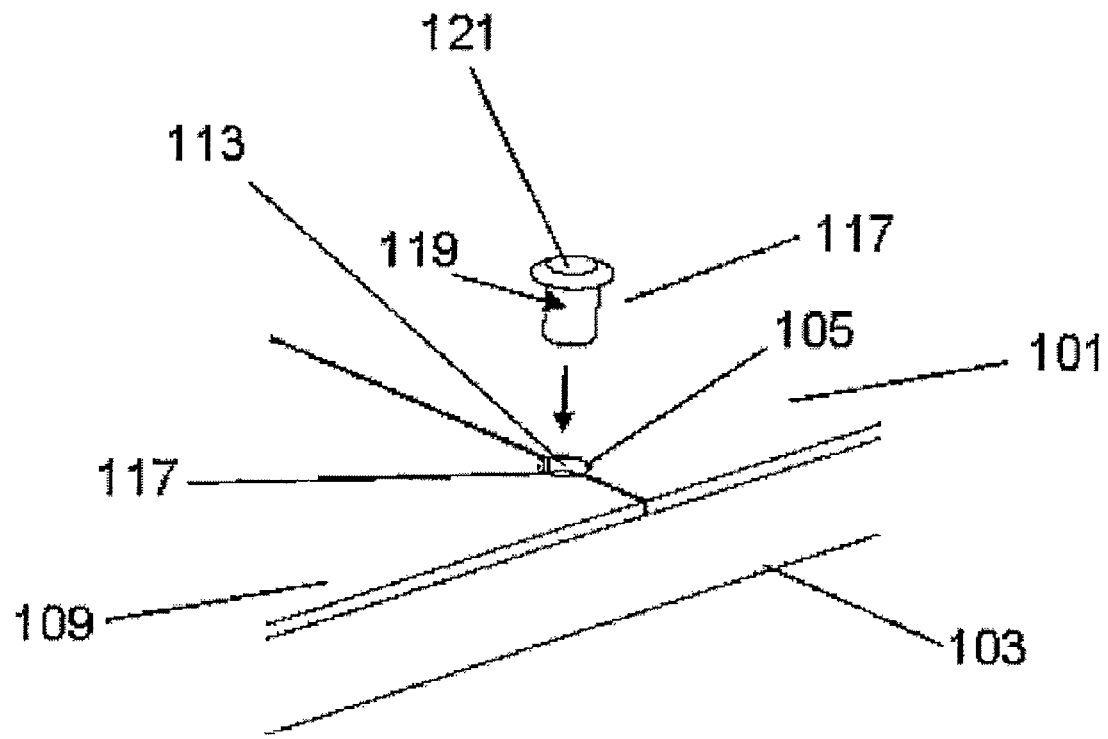
Figure 3:
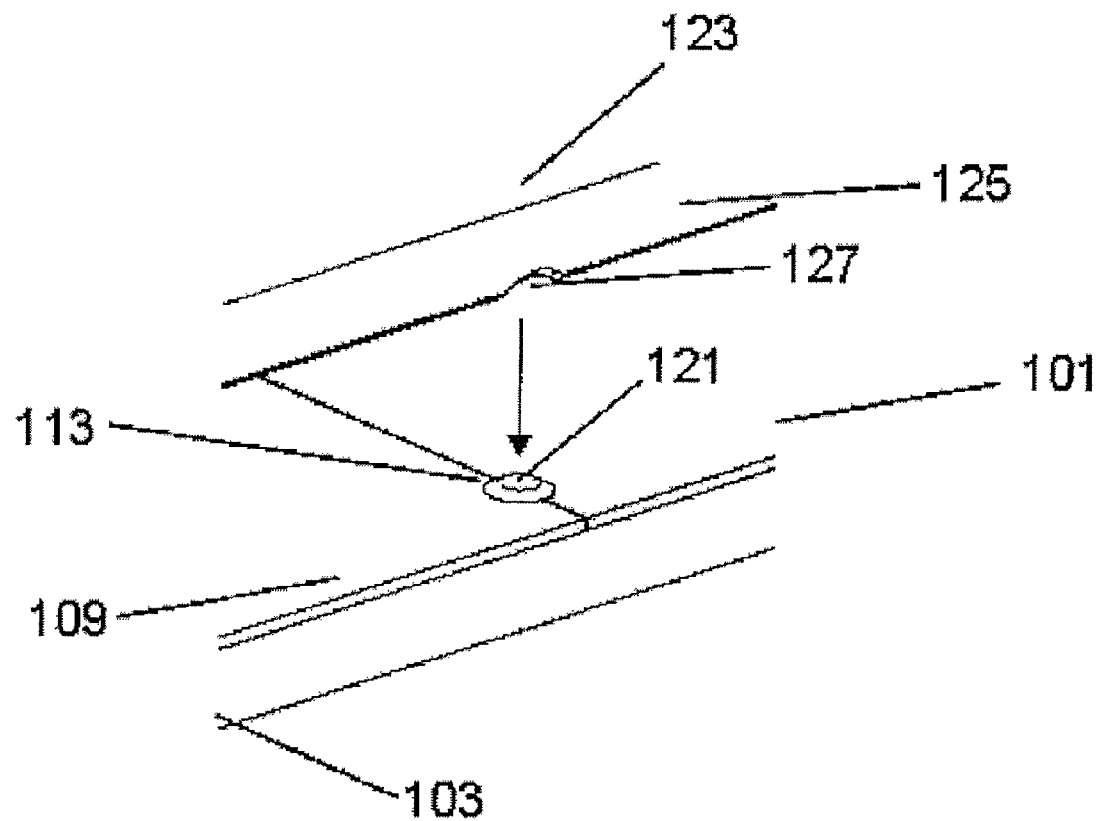

FIGS. 1 to 3 demonstrate steps of producing a printed circuit board arrangement according to an implementation form.

As shown in FIG. 1, a first printed circuit board 101 may be arranged on a metal base 103 forming a heat sink. The first printed circuit board 101 may comprise a half-circular cut 105 being arranged, for example, above a recess 107 which is formed in the metal base 103. The recess 107 may be formed by a hole, wherein the half-circular cut 105 may be formed as a half-hole having a radius corresponding to that of the recess 107.

With reference to FIG. 2, a second printed circuit board 109 is arranged adjacent to the first printed circuit board 101 on the metal base 103. The second printed circuit board 109 comprises a half cut 111 opposing the half-cut 105 of the first printed circuit board. Thus, the half cuts 105 and 111 form a circular recess 113 between the printed circuit boards 101 and 109. The recess 113 forms a gap between the both printed circuit boards 101 and 109. A further gap may be formed by a space between the printed circuit boards 101 and 109.

The circular recess 113 receives a conductive plug 117 being inserted into the recess into a direction depicted by the arrow shown in FIG. 2.

The conductive plug 117 comprises a shaft 119 and a plug head 121 which may be spherical or circular. The conductive plug 117 forming, for example, an EMC plug may be made of conductive silicon rubber or another conductive/flexible material. Hardness and shielding effect may be balanced to fit different applications and EMC shielding requirements. Furthermore, the plug 117 may be made of a non-conductive material and may be coated or covered with a layer of conductive material.

The shaft of the plug 117 may have a number of axial ribs to increase its ability to adjust to bigger mechanical tolerances and still seal against EMC radiation when pressed into the hole. The plug may also be made softer and more adjustable by making the foot hollow.

According to some implementation forms, the conductive plug 117 may be a molded plug shaped as a mushroom. In an interface line between the two PCBs 101, 109, a hole may be shaped in the heat sink, e.g. in a base plate 103, as depicted in FIG. 1. A diameter of the recess 113 being formed e.g. by a hole may correspond to the diameter of the conductive plug 117. The respective PCB edge may be shaped as a half-circle with the same diameter as the recess 107 and the plug 117. The PCBs 101, 109 may be placed so that the PCB half circle and heat sink recess 107 match as shown in FIG. 2.

As shown in FIG. 3, a continuous electromagnetic shield 123 is arranged above the printed circuit boards 101 and 109. The continuous electromagnetic shield 123 comprises a side wall 125 comprising a recess 127 having a shape corresponding to a shape of a profile of the plug head 121.

Figure 4:
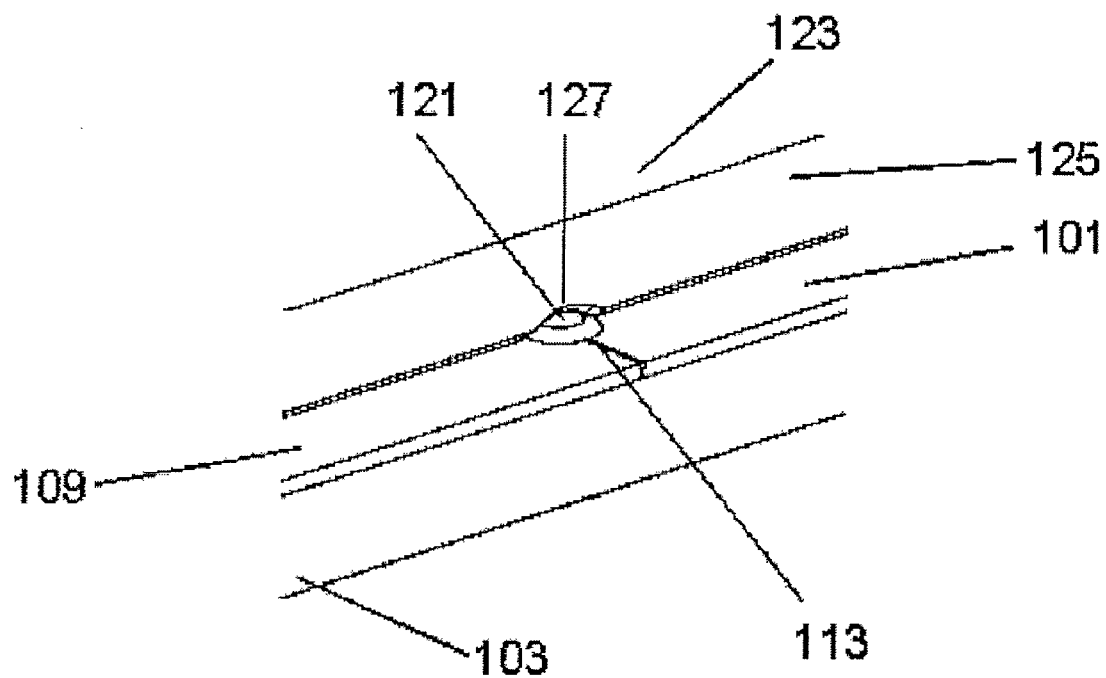
FIG. 4 shows a printed circuit board arrangement according to an implementation form.

FIG. 4 shows the resulting printed circuit board arrangement. The EMC cover wall 123 may be shaped with a slope and/or with a radius that matches the spherical radius of the EMC plug head 121.

Figure 5:
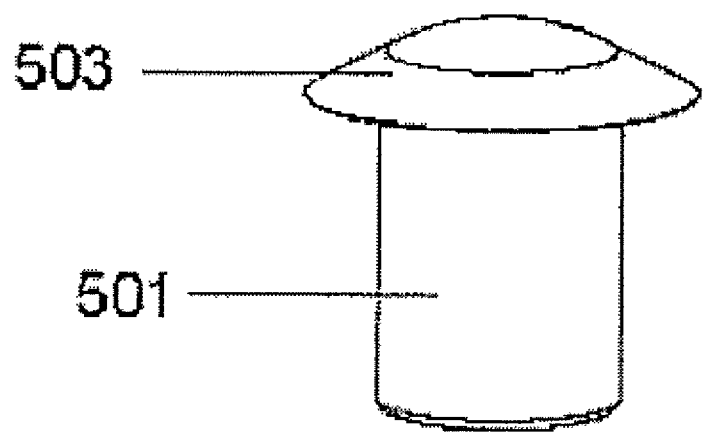
FIG. 5 shows a conductive plug according to an implementation form.

FIG. 5 shows an implementation form of a conductive plug, for example, the plug 117, having a shaft 501 and a spherical or circular head 503.

Figure 6:
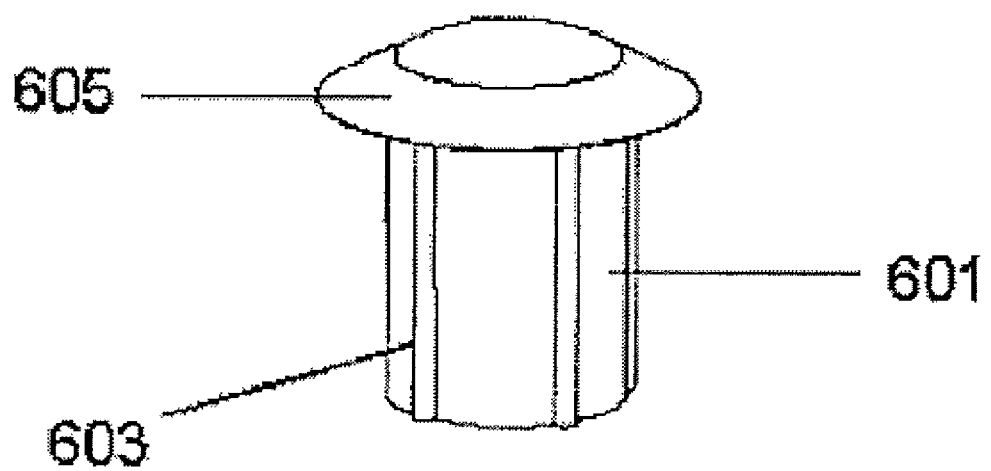
FIG. 6 shows a conductive plug according to an implementation form.

FIG. 6 shows another implementation form of a conductive plug, for example, the plug 117. The conductive plug comprises a shaft 601 provided with axial ribs 603 for increased sealing. The conductive plug further comprises a plug head 605 having, for example, a spherical profile and a circular boundary.

According to some implementation forms, standard materials such as conductive rubber in the EMC plug 117 and an optional FIP (Form In Place) gasket may be used. In particular, a combination of the properties of these materials and the symmetric spherical geometry of the plug 117 is exploited. According to some implementation forms, the plug head 121 may have a shape which may handle mechanical positional and geometrical tolerances in all directions. The plug 117 may also comprise conductive material.

According to some implementation forms, the spherical shape of the plug head 121 in combination with its electrical conductive properties enables providing for electrical connections reducing the EMC radiation. Furthermore, the material which may be used in the plug 117 is silicon rubber in combination with metal particles comprising, for example, Ag/Cu, Ag/Glass, Ag/Ni or Ni/C. The plug 117 may enable, due to its geometrical flexibility and ability, adjusting to surrounding mechanical parts such as the EMC cover 123 and the edges of the PCB boards 101, 109.

According to some implementation forms, the method of, for example, electrically joining the PCBs 101 and 109 and the EMC cover 123 may comprise using the plug 117 and the especially shaped EMC cover 123 wall with or without dispensed gasket, wherein the edges of the PCBs 101, 109 may be provided with cuts 105, 107 forming a recess for receiving the plug 117.

According to some implementation forms, a common gasket may be used for shielding the PCBs 101, 109, such as a conductive FIP gasket on the EMC cover walls 125. The gasket may be based on Silicon mixed with metal particles to achieve a shielding effect. The gasket may further be dispensed or molded on the EMC cover walls 125 and compressed against the PCB surface by screws through the cover into the heat sink below the PCB. The purpose of the gasket is to seal the space between cover and PCB surface caused by mechanical tolerances in the cover or in the PCB surface. According to the FIP dispensing approach, the gasket may be very soft when dispensed. The dispensing may be made in one plane (x-y) but after dispensing the gasket over the slope area, gravity will make the gasket to form after the wall slope/radius. The EMC cover 123 may be positioned above the plug 117 so that the FIP gasket on the wall compresses against the EMC plug head 121 and creates an EMC seal.

Preferably, the PCBs 101, 109 are placed in the same plane, so that, due to mechanical tolerances, there is a gap/space between the two boards. When only the electromagnetic cover is placed upon the PCBs 101, 109 common top surfaces, the EMC radiation leakage may occur in the gap between the boards. Thus, the gap may be filled with the conductive material to stop the leakage. In this regard, the mushroom-shaped plug manufactured, such as in conductive rubber, may stop the leakage.

The above-mentioned gasket may be formed by a dispensed gasket which may be produced by an XYZ-robot that is programmed to dispense a bead of conductive silicone directly onto the rim of a conductive housing. The bead height is normally between 0.5 to 2.5 mm. The dispensed silicone, which is a thixotropic liquid, is cured in place. There are two types of curing systems on the market. Room temperature curing systems require several hours or days to cure. Heat curing systems cure in a much shorter time using heat. The material cures in 30 minutes in an oven at 100 degrees C. By using heat for curing we achieve shorter lead times, quicker feedback and quality control, better compression set and no risk of silicone bleeding. The housing of a shielding may is made of metal or plastic depending on the mechanical requirements of the application. Commonly used metals are aluminium and magnesium. The dispensing process is very flexible and may handle almost any size and shape of substrate. If plastic is to be used it is important to select a material that may stand curing at 100 degrees C. for 30 minutes without deformation or warping. Parts of metal, such as aluminium, may be used for dispensing shielding gaskets without surface treatment. To improve corrosion resistance and the electrical contact with the gasket, different kinds of surface treatment may be applied to a metal part. This increases the cost of the part but the shielding effect is considerably improved in both the short and long term. Aluminium may in a mild environment be used for a shield as it is. For harsh environments it may be chromated or plated with nickel/tin or copper/silver. Magnesium parts should always be plated to stop surface oxidation. Electroplating of copper and nickel and possibly a topcoat of black chrome or white bronze or similar are often used. Housings of plastic may be metalized in order to act as an EMI shield. The most common methods are electrolytic or electroless copper/nickel, vacuum-deposited aluminium and conductive painting. The different methods all have their advantages and disadvantages. For the selection of surface treatment it is important to consider shielding requirements, ageing requirements, costs and logistics. To achieve an electrical contact with a PCB a dispensed gasket needs to be compressed 5-10% of its original height. Increased compression does not improve the electrical contact to a larger extent. In a construction the gasket should be designed to take up the tolerances and close any gap between the housing and the PCB. To achieve a good seal and electrical contact it is recommended that the gasket is compressed between 10 and 50%. The nominal value could be 20-30%. Mechanical compression stops are recommended. Knowing the tolerances of the mechanical system the gasket height should be calculated. Normal gasket heights are between 0.5 and 2.5 mm. For standard dispensing materials, the height up to 1.0 mm may be achieved with one single bead. Heights above 1.0 mm are preferably made by dispensing a second bead on top of the first one. With the new material process, heights up to 1.8 mm may be achieved with only one bead. Due to the free forming process and the viscosity of the material is the width determined once the height is decided.

According to some implementation forms, different PCB materials such as FR4 or Rogers may be used for the PCBs 101, 109 in parallel with the common EMC cover 123, wherein connecting parts and components are joined to the two PCBs 101, 109 simultaneously without EMC leakage.

According to some implementation forms, standard materials such as conductive rubber in the EMC plug and FIP gasket may be used. In particular, a combination of the properties of these materials and the symmetric spherical geometry of the plug 117 is exploited. According to some implementation forms, the plug head 121 may have a shape which may handle mechanical positional and geometrical tolerances in all directions. The plug 117 also comprises conductive material.

According to some implementation forms, the overall costs may be reduced as two separate EMC shielding covers are not necessary. Furthermore, a reduced PCB area is occupied. In addition, components may be supported which are connected to both PCBs without EMC leakage. Hence, double walls reducing the available PCB area and not supporting components connected to both PCBs may be avoided. In addition, the single, continuous electromagnetic cover allows for components to cross between two PCBs.

What is claimed is:

1. A printed circuit board arrangement, comprising:
   a first printed circuit board having a conductive surface;
   a second printed circuit board having a conductive surface, the second printed circuit board being arranged adjacent to the first printed circuit board;
   an electromagnetic shield arranged adjacently to the first printed circuit board and the second printed circuit board; and
   an electrically conductive plug arranged in a gap between the first printed circuit board and the second printed circuit board, the electrically conductive plug electrically connecting the conductive surfaces of the first printed circuit board and of the second printed circuit board with the electromagnetic shield.

2. The printed circuit board arrangement of claim 1, wherein the conductive plug is arranged in a recess forming the gap, the recess being formed by a side cut formed in the first printed circuit board and by a side cut formed in the second printed circuit board.

3. The printed circuit board arrangement of claim 1, wherein the conductive plug comprises a shaft and a plug head arranged on top of the shaft, the plug head having a spherical shape or a circular boundary.

4. The printed circuit board arrangement of claim 1, wherein the conductive plug comprises a shaft provided with axial ribs.

5. The printed circuit board arrangement of claim 1, wherein the conductive plug comprises a hollow shaft.

6. The printed circuit board arrangement of claim 1, wherein the conductive plug comprises an elastic material, in particular silicone or rubber, provided with conductive particles, in particular with conductive particles comprising at least one of: AG, Cu, Ag and CU, Ni, Ag and Ni, Ni and C.

7. The printed circuit board arrangement of claim 1, wherein the conductive plug is made of a conductively coated non-conductive material.

8. The printed circuit board arrangement of claim 1, wherein the conductive plug comprises a shaft arranged between the first printed circuit board and the second printed circuit board, and a plug head protruding above the conductive surfaces of the first printed circuit board and the second printed circuit board, wherein the electromagnetic shield or one of its walls comprises a recess conductively receiving the plug head.

9. The printed circuit board arrangement of claim 8, wherein a shape of the recess corresponds to a side profile of the plug head.

10. The printed circuit board arrangement of claim 1, wherein the electromagnetic shield or one of its walls is provided with a conductive gasket.

11. The printed circuit board arrangement of claim 1, wherein the first printed circuit board and the second printed circuit board are arranged on a metal base, the metal base comprising a recess for receiving a bottom end of a shaft of the conductive plug.

12. A method for producing a printed circuit board arrangement, the method comprising:
- arranging a first printed circuit board having a conductive surface and a second printed circuit board having a conductive surface adjacent to each other;
- arranging an electrically conductive plug in a gap between the first printed circuit board and the second printed circuit board to electrically connect the conductive surfaces; and
- arranging a continuous electromagnetic shield adjacently to the first printed circuit board and the second printed circuit board, thereby electrically connecting the electromagnetic shield to the conductive plug and to the conductive surfaces.

13. The method of claim 12, further comprising:
- forming a half-circular side cut in the first printed circuit board; and
- forming a half-circular side cut in the second printed circuit board;
- the half-circular side cuts forming a circular recess when aligning the first and second printed circuit board, the circular recess forming a gap accommodating the conductive plug.

* * * * *